United States Patent [19]

Giancola

[11] Patent Number: 5,123,974
[45] Date of Patent: Jun. 23, 1992

[54] PROCESS FOR INCREASING THE TRANSITION TEMPERATURE OF METALLIC SUPERCONDUCTORS

[76] Inventor: Dominic J. Giancola, 12 Cameron Ct., Princeton, N.J. 08540

[21] Appl. No.: 693,577

[22] Filed: Apr. 30, 1991

Related U.S. Application Data

[62] Division of Ser. No. 97,175, Sep. 16, 1987, Pat. No. 5,073,209.

[51] Int. Cl.$^5$ ................................................. C22F 1/00
[52] U.S. Cl. ...................................... 148/98; 148/103; 148/108; 148/668; 428/930; 505/918; 505/805; 505/806
[58] Field of Search ................ 148/13, 103, 108, 133, 148/11.5 F; 428/930; 505/1

[56] References Cited

U.S. PATENT DOCUMENTS

| | | | |
|---|---|---|---|
| 3,100,730 | 8/1963 | Post et al. | 148/13 R |
| 4,088,512 | 5/1978 | Pickus et al. | 148/133 |
| 4,505,762 | 3/1985 | Fukutsuka et al. | 148/133 |
| 4,544,421 | 10/1985 | Springer | 148/103 |
| 4,649,248 | 3/1987 | Yamaguchi et al. | 148/103 |
| 4,950,335 | 8/1990 | Couderchon | 148/103 |
| 4,975,411 | 12/1990 | Danby et al. | 148/108 |

OTHER PUBLICATIONS

Nishihara et al. Phys. Rev. B 31 (1985) 5775.
Koch, C. C. J. Phys. Chem. Solids, 34 (1973) 1445 Superconducting Materials (eds.)
Savitskii et al., Plenum, N.Y. 1973, pp. 190–196.

*Primary Examiner*—Upendra Roy

[57] ABSTRACT

In one embodiment this invention provides a process for decreasing the resistivity of an electrical conductor.

The process involves the application of high temperature and an external field to a conductor to induce a current flow and physicochemical transition in the conducting matrix.

9 Claims, No Drawings

PROCESS FOR INCREASING THE TRANSITION TEMPERATURE OF METALLIC SUPERCONDUCTORS

This application is a division, of application Ser. No. 07/097,175, filed Sep. 16, 1987, now U.S. Pat. No. 5.073,209.

BACKGROUND OF THE INVENTION

It is known that the electrical resistance of a conductor within a defined temperature range can be varied over broad limits. At low temperatures the resistance of a metal such as pure bismuth or tungsten can be varied in a ratio of 1:100,000 by means of changes in a magnetic field surrounding the conductor.

It is also known that the resistivity of many conductors will decrease to zero as the temperature approaches absolute zero, i.e., a state of superconductivity is evident.

The change of resistance in a superconductor is dependent on changes of magnetic field and temperature in accordance with the following expression:

$$dR = \left(\frac{\delta R}{\delta H}\right)_T dH + \left(\frac{\delta R}{\delta T}\right)_H dT$$

which shows the dependence of the resistance R on changes of the field strength H at constant temperature, and on changes in the temperature at constant field strength H.

J. Math. Phys., 25(11), 2325(1984) by A. C. Eringen proposes a general nonlocal continuum theory which is applied to superconductivity, and which treats Maxwell's theory of electromagnetism as a special case.

Another critical factor which affects the resistivity of a conducting medium is the physicochemical structure of the matrix. Thus, heavy doping of a semiconductor such as gallium arsenide can yield a medium which is superconducting at temperatures approaching zero degree Kelvin.

Recent events have focused attention on the superconducting species of the copper oxide perovskit family of crystalline compounds. Interest was initiated with the discovery of superconductivity above 30 K by J. G. Bednorz and K. A. Mueller in $La_{2-x}Ba_xCuO_{4-y}$, as reported in Z. Phys., B64, 189 (1986).

The prospect of a room temperature superconductor has stimulated a broad scope of investigational activities in many academic and corporate laboratories. Physical Review Letters and the Japanese Journal of Applied Physics and other publications have begun to report new advances in superconductivity, such as the 90 K series of compositions based on $YBa_2Cu_3O_x$ and the yttrium-lanthanide substitutions.

There is intense interest in the development of new and improved electrical conductors having exceptional properties, and in processes for their preparation.

Accordingly, it is an object of this invention to provide a process for the preparation of electrical conductors with decreased resistivity.

It is another object of this invention to provide a process for raising the critical temperature $T_c$ level of a superconducting medium.

Other objects and advantages of the present invention shall become apparent from the accompanying description and examples.

DESCRIPTION OF THE INVENTION

One or more objects of the present invention are accomplished by the provision of a process which comprises heating a conductor of known electrical resistivity to a viscoelastic state, establishing external field-induced anisotropic electrical and magnetic properties in the conductor, and cooling the said conductor to the solid state while maintaining the external field-induced properties; wherein the conductor exhibits a decreased resistivity after the process treatment.

In another embodiment this invention provides a process which comprises heating a conductor with a measured electrical resistivity to provide a physical state characterized by lattice deformation and atomic rearrangement, applying an external field to the heated conductor to induce a zone of higher average electron density than that of the conductor medium, and cooling the said conductor to ambient temperature while maintaining the induced electron density zone; wherein the conductor exhibits a decreased resistivity after the process treatment.

In another embodiment this invention provides a process which comprises heating a conductor to a viscoelastic state, applying an external field to the heated conductor to form a zone which exhibits a lower average resistivity than the conductor medium, and cooling the conductor to ambient temperature while maintaining the lower resistivity zone.

In another embodiment this invention provides a process which comprises (1) subjecting an electrical conductor to annealing temperature conditions, (2) applying an external field to the conductor to induce a current flow during the annealing period, and (3) cooling the conductor to ambient temperature; wherein the conductor exhibits a decreased resistivity at 20° C. after the process treatment.

In another embodiment this invention provides a process which comprises (1) subjecting a superconductor to annealing temperature conditions, (2) applying an external field to the superconductor to induce a current flow during the annealing period, and (3) cooling the superconductor to ambient temperature; wherein the superconductor exhibits a higher critical temperature $T_c$ after the process treatment.

In another embodiment this invention provides a process which comprises (1) subjecting a ceramic superconductors to an annealing temperature in the range between about 400-900° C., (2) applying an external field to the superconductor to induce a current flow during the annealing period, and (3) cooling the superconductor to ambient temperature; wherein the superconductor exhibits a higher critical temperature $T_c$ after the process treatment.

In another embodiment this invention provides a superconductor which is characterized by electrical and magnetic properties comprising (1) a critical temperature $T_c$ above about 100 K; (2) a critical magnetic field $H_c$ above about 50 tesla; and (3) a zero field critical current density $J_c$ above about 10,000 amperes per square centimeter.

In another embodiment this invention provides a process for increasing the mean free path of conduction electrons in a conductor which comprises (1) subjecting an electrical conductor to annealing temperature conditions, (2) applying an external field to the conductor to induce a current flow during the annealing period, and (3) cooling the conductor to ambient temperature.

The application of an invention embodiment to a semiconductor such as gallium arsenide can increase the mean free path of conduction electrons, for example, from 1000 angstroms to more than 2000 angstroms.

In a further embodiment this invention provides a process for decreasing the resistivity of a solid conductor which comprises (1) providing a conducting medium which contains between about 0.1-20 weight percent of a conductivity-enhancing dopant component, (2) subjecting the doped conductor to annealing temperature conditions, (3) applying an external field to the conductor to induce a current flow during the annealing period, and (4) cooling the conductor to ambient temperature.

The term "conductor" as employed herein refers to electrical conducting media which include normal conductors, semiconductors, superconductors, and insulators which have a conducting zone.

The term "viscoelastic" as employed herein refers to a conducting medium which is in a plastically deformable state.

The term "annealing" as employed herein refers to temperature conditions which are applied to a conductor to impart one or more structural changes which include lattice deformation, atomic rearrangement or translation, and phase transitions in crystalline matrices, or rearrangement of short range atomic aggregates in solid solutions and amorphous solids.

The process embodiments of the present invention are applicable to conventional electrical conductors, in the form of wires, coatings on substrates, tubes, bars, laminates, single crystals, and the like.

The annealing temperature in the process embodiments normally is in the range between about 400° C. and the melting point of the conductor which is being process treated.

The annealing cycle is maintained for a period between about 0.1-20 hours, as necessary to achieve the desired physicochemical transitions in the conductor.

The external field, i.e., an electric field or magnetic field or both, is applied to the conductor during the annealing period to induce a current flow.

The current flow induction in the conductor is an essential aspect of the process embodiments. The induced current flow has a current density of at least about 0.1 ampere per square centimeter, and typically will be in the range between about 1-100 amperes per square centimeter.

When the applied external field is a magnetic field, the field strength typically will be in the range between about 0.5-5 tesla.

The temperature and external field conditions applied to the conductor are balanced so that the essential current flow is induced in the conductor circuit, without a detrimental electromigration of ions which can be driven by an electrical potential gradient in the conductor.

Other factors which affect the ultimate properties of the conductor under treatment and which require control are (1) the environment in contact with the conductor during the annealing and cooling steps, and (2) the rate of cooling after the annealing period is completed.

Depending on the particular conductor being treated, the selected atmosphere is either oxidizing or reducing or inert. An oxidizing environment is provided by air or a metered partial pressure of molecular oxygen. Hydrogen gas is satisfactory as a reducing environment, and gases such as helium, nitrogen or argon can be utilized as an inert medium.

With respect to the rate of cooling of the conductor after annealing, generally it is advantageous to have either a fast cooling rate or a slow cooling rate, rather than a moderate rate of cooling. A suitable fast rate of cooling is a rate of more than about 100 degrees per second. A suitable slow rate of cooling is a rate of less than about two degrees per minute, usually while maintaining the applied external field.

The present invention process embodiments are applicable for the improvement of normal electrical conductors, even though the resistivities of metal conductors such as copper (1.724 microhm/cm) and aluminum (2.824 microhm/cm) have low values at 20° C.

Illustrative of a process application, a commercial operation which manufactures copper-coated aluminum wire on a continuous basis can be adapted in accordance with the present invention. The resistivity of the wire is decreased as compared to the untreated wire, due in part to realignment of crystal lattice distortions in the aluminum matrix, and in part to a phase transition at the copper-aluminum sheath interface.

The present invention process embodiments have particular advantage when applied to the treatment of superconducting media.

Illustrative of one type of superconductor is a metal composition corresponding to the formula:

$$A_3B$$

where A is selected from the group consisting of niobium and vanadium, and B is selected from the group consisting of aluminum, gallium, indium, silicon, germanium and tin.

Illustrative of anther type of superconductor is a ceramic composition corresponding to the formula:

$$YBa_2Cu_3O_{4-9}$$

This type of composition is an oxygen-deficient perovskite with ordering of the yttrium and barium ions.

A superconductor is annealed for a period between about 0.5-10 hours, and normally the annealed medium is cooled at a slow rate, and the medium is in contact with molecular oxygen during the annealing the cooling periods.

A ceramic superconductor with a critical temperature $T_c$ less than 100 K (e.g., 96 K) before process treatment, can have a critical temperature $T_c$ greater than about 100 K (e.g., 105 K) after process treatment.

A present invention process embodiment is particularly effective for decreasing the resistivity of an electrical conductor which contains an added content of a conductivity-enhancing dopant component. Illustrative of the dopant component is at least one inorganic compound selected from the group consisting of chalcogenides, silicides, carbides, nitrides, arsenides, borides and halides.

Suitable dopant compounds include ZnO, CuO, CdS, HgSe, CdPo, MgSi, $CdSiP_2$, SiC, WC, GaN, AlAs, GaAs, $ZnSiAs_2$, BN, NbN, BAs, $B_2O_2$, CuF, AgF, $PbCl_2$, and the like.

A normal conductor such as copper or aluminum wire with improved properties in accordance with the present invention can be utilized in conventional applications such as power transmission lines. A present invention superconductor can be employed as a component in an electrical device, such as a superfast switch based on a Josephson junction structure.

The following examples are further illustrative of the present invention. The components and specific ingredients are presented as being typical, and various modifications can be derived in view of the foregoing disclosure within the scope of the invention.

EXAMPLE I

This Example illustrative the preparation of a $YBa_2Cu_3O_7$ superconductor in accordance with the present invention.

$Y_2O_3$, $BaCO_3$ and $CuO$ in stoichiometric proportions are mixed and ground to a homogeneous fine powder. The powder sample is calcined for three hours at 900° C. The calcined mixture is ground to a fine powder, and cold pressed in the form of a cylinder (5 mm×2 cm).

Platinum wire leads are attached to the cylinder ends and connected to a constant DC power source (Hewlett-Packard 6269B constant current DC power supply).

The cylinder is transferred to a furnace with an oxygen atmosphere. An electric field is applied to the cylinder, and the furnace temperature is raised gradually to 900° C. The 900° C. temperature is maintained for six hours, during which period the potential across the cylinder adjusts as required to provide a current density of at least 0.1–10 amperes per square centimeter in the cylinder. The furnace then is cooled at a rate of about one degree per minute.

The critical temperature $T_c$ onset of the conductor before the furnace treatment is 93 K, and the $T_c$ onset is 102 K after the furnace treatment.

EXAMPLE II

This Example illustrates the preparation of wire superconductors in accordance with the present invention.

A sample of $YBa_2CuA_3O_x$ is prepared as a fine powder by grinding. The sample is heated at 900° C. in air for six hours. The sample is reground and heated at 700° C. in pure $O_2$ for 24 hours. An X-ray diffractometer trace in the sample indicates single phase orthorhombic $YBa_2Cu_3O_{6.8}$.

The sample is reground to 400 mesh sieve particle size. The powder is tapped into a 3.0 mm hole which has been drilled into a 1.0 cm diameter rod of silver. The rod is swaged and drawn to a diameter of 0.5 mm at room temperature.

A section of the wire is connected to a constant current DC power source. The wire is transferred to a furnace with an oxygen atmosphere. A current density of 10 amperes per square centimeter is established in the wire, and the furnace temperature is raised to 750° C., and maintained for three hours. The furnace then is cooled at a rate of about 2 degrees per minute.

The critical temperature $T_c$ onset of the wire before the furnace treatment is about 90 K, and the $T_c$ onset is in the range of about 95–110 K after the furnace treatment.

The above described procedure is repeated employing a copper-coated niobium carbide wire which is prepared by a powder-in-tube technique as described in U.S. Pat. No. 4,575,927. The critical temperature $T_c$ onset of the niobium carbide wire before the furnace treatment is about 11 K, and the $T_c$ onset is about 16 K after the furnace treatment.

The present invention process embodiment demonstrated above for the production of superconductor wire is adapted for continuous operation.

A furnace zone is provided which is equipped with an electromagnet which applies a magnetic field to a superconductor wire in the furnace zone to induce a current density of at least about one ampere per square centimeter in the wire which is in moving contact with circuit electrodes.

The residence time of the moving wire in the furnace zone is about 1–2 minutes, and the furnace zone temperature is maintained at about 900° C.

The moving wire is passed into an adjacent annealing zone, where the wire is collected (e.g., on a spool), and annealed at 700° C. in pure oxygen for 1–2 hours. Some types of superconductor wires can be rapid cooled, while others require slow cooling to preserve the optical superconducting properties.

What is claimed is:

1. A process which comprises (1) subjecting a superconductor to annealing temperature conditions, (2) applying an external field to the superconductor to induce a current flow during the annealing period, and (3) cooling the superconductor to ambient temperature; wherein the superconductor exhibits a higher critical temperature $T_c$ after the process treatment.

2. A process in accordance with claim 1 wherein the superconductor is a metal composition corresponding to the formula:

$$A_3B$$

where A is selected from the group consisting of niobium and vanadium, and B is selected from the group consisting of aluminum, gallium, indium, silicon, germanium and tin.

3. A process in accordance with claim 1 wherein the annealing temperature is in the range between about 400° C. and the melting point of the superconductor.

4. A process in accordance with claim 1 wherein the annealing conditions are maintained for a period between about 0.5–10 hours.

5. A process in accordance with claim 1 wherein the applied external field is an electric field.

6. A process in accordance with claim 1 wherein the applied external field is a magnetic field.

7. A process in accordance with claim 1 wherein the applied external field is a combination of an electric field and a magnetic field.

8. A process in accordance with claim 1 wherein the induced current flow has a current density of at least about 0.1 ampere per square centimeter, and up to about 100 amperes per square centimeter.

9. A process in accordance with claim 1 wherein the cooling of the superconductor is at a rate less than about two degrees per minute while maintaining the applied external field.

* * * * *

UNITED STATES PATENT OFFICE
CERTIFICATE OF CORRECTION

Patent No. 5,123,974        Dated June 23, 1992

Inventor(s) Dominic J. Giancola

It is certified that error appears in the above-identified patent and that said Letters Patent is hereby corrected as shown below:

Col. 1, line 34, "2325(1984)" Should be --3235(1984)--.

Col. 1, line 46, "perovskit family" Should be --perovskite family--.

Col. 5, line 12, "This Example illustrative" Should be
        --This Example illustrates--.

Signed and Sealed this

Twelfth Day of July, 1994

Attest:

BRUCE LEHMAN

*Attesting Officer*     *Commissioner of Patents and Trademarks*